US011699976B2

(12) United States Patent
Bruzzone et al.

(10) Patent No.: US 11,699,976 B2
(45) Date of Patent: *Jul. 11, 2023

(54) MAGNETIC ABSORBERS FOR PASSIVE INTERMODULATION MITIGATION

(71) Applicant: 3M INNOVATIVE PROPERTIES COMPANY, St. Paul, MN (US)

(72) Inventors: Charles L. Bruzzone, Woodbury, MN (US); Jeffrey A. Tostenrude, Leander, TX (US)

(73) Assignee: 3M INNOVATIVE PROPERTIES COMPANY, St. Paul, MN (US)

( * ) Notice: Subject to any disclaimer, the term of this patent is extended or adjusted under 35 U.S.C. 154(b) by 2 days.

This patent is subject to a terminal disclaimer.

(21) Appl. No.: 17/449,827

(22) Filed: Oct. 4, 2021

(65) Prior Publication Data

US 2022/0052643 A1 Feb. 17, 2022

Related U.S. Application Data

(63) Continuation of application No. 15/733,130, filed as application No. PCT/IB2020/053939 on Apr. 27, 2020, now Pat. No. 11,165,391.

(Continued)

(30) Foreign Application Priority Data

Mar. 19, 2020 (CN) .......................... 202010198693.5

(51) Int. Cl.
*H01Q 1/00* (2006.01)
*H01Q 19/08* (2006.01)
(Continued)

(52) U.S. Cl.
CPC ............... *H03C 7/022* (2013.01); *H01P 1/23* (2013.01); *H01Q 1/002* (2013.01); *H01Q 1/246* (2013.01)

(58) Field of Classification Search
CPC ...... H01P 1/04; H01P 1/22; H01P 1/23; H01P 3/16; H01Q 1/00; H01Q 15/00;
(Continued)

(56) References Cited

U.S. PATENT DOCUMENTS 9,450,310 B2 9/2016 Bily et al.
10,135,123 B1 11/2018 Amitz et al.
(Continued)

OTHER PUBLICATIONS

PCT International Search Report from PCT/IB2020/053939, dated Jul. 7, 2020, 3 pages.
(Continued)

*Primary Examiner* — Tho G Phan
(74) *Attorney, Agent, or Firm* — Jonathan L. Tolstedt

(57) ABSTRACT

A wireless communication system including an electrically conductive passive medium capable of simultaneously propagating therealong electromagnetic first and second currents at different respective frequencies F1 and F2, the electrically conductive passive medium including an electrically conductive first passive linear medium portion adjacent an electrically conductive first passive nonlinear medium portion, the first passive nonlinear medium portion capable of generating an intermodulation current based on a nonlinear interaction between the first and second currents, the intermodulation current having a frequency Fi equal to nF1+mF2 and propagating along the first passive nonlinear medium portion, m and n being positive or negative integers; and a first magnetic film disposed proximate an electrically conductive external surface of the first linear medium portion, such that when the first and second currents propagate along the first passive linear medium portion toward the first passive nonlinear medium portion, the magnetic film reduces or prevents the generation of the intermodulation current in the first passive nonlinear medium portion by attenuating at least portions of the first and second currents.

7 Claims, 5 Drawing Sheets

Related U.S. Application Data

(60) Provisional application No. 62/908,004, filed on Sep. 30, 2019.

(51) Int. Cl.
| | | |
|---|---|---|
| *H01Q 19/18* | (2006.01) | |
| *H01P 1/04* | (2006.01) | |
| *H04B 3/52* | (2006.01) | |
| *H03C 7/02* | (2006.01) | |
| *H01P 1/23* | (2006.01) | |
| *H01Q 1/24* | (2006.01) | |

(58) Field of Classification Search
CPC ........ H01Q 1/002; H01Q 19/06; H01Q 13/02; H01Q 3/10; H01Q 19/08; H01Q 19/18; H01Q 1/24; H01Q 13/24; H01Q 1/246; H01Q 21/00; H01Q 5/36; H01Q 5/364; H03C 7/02; H03C 7/022; H04B 10/54; H04B 3/52; H04B 3/54; H04B 3/56
See application file for complete search history.

(56) References Cited

U.S. PATENT DOCUMENTS

| | | |
|---|---|---|
| 10,505,584 B1 | 12/2019 | Henry et al. |
| 10,535,923 B2 | 1/2020 | Black et al. |
| 10,854,960 B2 * | 12/2020 | Bean ............... H02J 50/27 |
| 11,165,391 B2 * | 11/2021 | Bruzzone ............ H01P 1/23 |
| 2012/0139656 A1 | 6/2012 | Henrie |
| 2017/0279194 A1 * | 9/2017 | Black ............... H01Q 3/2605 |
| 2018/0358708 A1 | 12/2018 | Ben-Bassat |
| 2020/0350652 A1 * | 11/2020 | Ondracek ............ H01Q 5/50 |

OTHER PUBLICATIONS

Stitzer, Steven N. "Frequency Selective Microwave Limiting in Thin Yig Films", IEEE Trans Magnetics, Sep. 30, 1983, vol. Mag-19, No. 5, pp. 1874-1876.

Intermodulation interference caused by passive nonlinearity of communication system, Zhang Shiquan, Journal of Shaanxi Normal University (Natural Science Edition), published on Mar. 31, 2004.

* cited by examiner

MAGNETIC ABSORBERS FOR PASSIVE INTERMODULATION MITIGATION

SUMMARY

In some aspects of the present description, a wireless communication system is provided, including an electrically conductive passive medium capable of simultaneously propagating therealong electromagnetic first and second currents at different respective frequencies F1 and F2, the electrically conductive passive medium including an electrically conductive first passive linear medium portion adjacent an electrically conductive first passive nonlinear medium portion, the first passive nonlinear medium portion capable of generating an intermodulation current based on a nonlinear interaction between the first and second currents, the intermodulation current having a frequency Fi equal to nF1+mF2 and propagating along the first passive nonlinear medium portion, m and n being positive or negative integers; and a first magnetic film disposed proximate an electrically conductive external surface of the first linear medium portion, such that when the first and second currents propagate along the first passive linear medium portion toward the first passive nonlinear medium portion, the magnetic film reduces the generation of the intermodulation current in the first passive nonlinear medium portion by attenuating at least portions of the first and second currents.

In some aspects of the present description, a wireless communication system is provided, including an antenna; an electrically conductive passive linear medium portion electrically interconnected with an electrically conductive passive nonlinear medium portions, such that when the antenna radiates electromagnetic first and second waves at different respective frequencies F1 and F2, the first and second waves induce respective first and second currents propagating through the first passive nonlinear medium portion, the first passive nonlinear medium portion mixing the first and second currents to generate a third current having a frequency nF1+mF2 and propagating along the passive nonlinear and linear medium portions, m and n being positive or negative integers; and a magnetic film disposed on the passive linear, but not the nonlinear, medium portion and absorbing at least a portion of the third current.

In some aspects of the present description, a wireless communication system is provided, including one or more antennas; a plurality of spaced apart electrically conductive first sections; a plurality of electrically conductive second sections interconnecting the first sections, such that when the one or more antennas radiate electromagnetic first and second waves at different respective frequencies F1 and F2, the first and second waves induce respective first and second currents at the respective F1 and F2 frequencies propagating through the first and second sections, the first sections mixing the first and second currents to generate a third current at a frequency Fi different from F1 and F2, such that the third current propagates along the first and second sections and causes the first, but not the second, sections to radiate electromagnetic waves at the Fi frequency; and a magnetic film disposed on an electrically conductive surface of each second section to absorb at least a portion of the third current propagating along the second section.

In some aspects of the present description, a wireless communication system is provided including one or more antennas; one or more transceivers coupled to the one or more antennas; a plurality of electrically conductive passive linear medium portions interconnected with a plurality of electrically conductive passive nonlinear medium portions, each linear and nonlinear medium portion capable of simultaneously propagating therealong electromagnetic first and second currents at different respective frequencies F1 and F2, each passive nonlinear portion, but not linear portion, capable of mixing the first and second currents to generate a third current having a frequency nF1+mF2 and propagating along the passive nonlinear medium portion, m and n being positive or negative integers; and a magnetic film disposed on at least some of the linear, but none of the nonlinear, medium portions.

TECHNICAL FIELD

The invention relates to wireless communication systems. In particular, the invention relates to systems and methods for mitigating the effects of passive intermodulation distortion in wireless communication systems.

BACKGROUND

As wireless communication networks evolve, signal quality (and, more specifically, signal-to-noise ratio, or SNR) becomes increasingly important. Higher orders of modulation are used to achieve very high data rates and require correspondingly higher levels of SNR. A common cause of SNR degradation is Passive Intermodulation (PIM) distortion, which can significantly reduce the performance and capacity of a network. PIM distortion is created when multiple frequencies encounter a non-linear material or feature, which then generate sum and difference combinations (products) of the fundamental frequencies and their harmonics. The resulting products often occur in uplink/receive frequency bands where the signal of interest is very weak, making coherent reception very difficult or impossible.

There are many mechanisms through which PIM can be created or propagated. Typically, the interactions and interconnections of electrically conductive mechanical components in a system can create a nonlinear element in the system. A nonlinearity may, in some cases, be caused by poor metal-to-metal contact at the location of an antenna mounting bracket, or if the bracket comprises a junction between dissimilar materials. Other causes of nonlinearities may be contamination, loose connections, nearby metal objects, or a variety of other causes.

DETAILED DESCRIPTION

Figure 2:
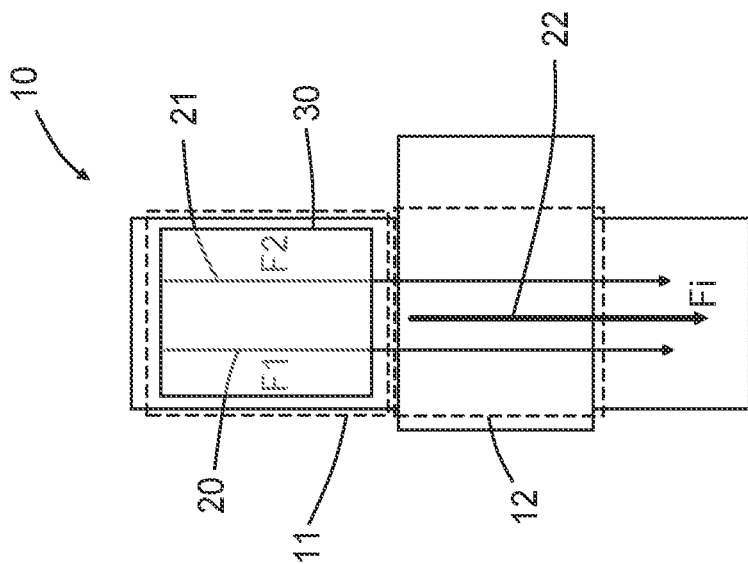
FIG. 2 is a side view of an electrically conductive passive medium capable of propagating currents in a wireless communication system, in accordance with an embodiment of the present description.

In the following description, reference is made to the accompanying drawings that form a part hereof and in which various embodiments are shown by way of illustration. The drawings are not necessarily to scale. It is to be understood that other embodiments are contemplated and may be made without departing from the scope or spirit of the present description. The following detailed description, therefore, is not to be taken in a limiting sense.

As wireless communication networks evolve, signal quality (and, more specifically, signal-to-noise ratio, or SNR) becomes increasingly important. Higher orders of modulation (64QAM, 256QAM, etc.) are used to achieve very high data rates and require correspondingly higher levels of SNR. A common cause of SNR degradation is Passive Intermodulation (PIM) distortion, which can significantly reduce the performance and capacity of a network. PIM distortion ("PIM" for short) is created when multiple frequencies encounter a non-linear material or feature, which then generate sum and difference combinations (products) of the fundamental frequencies and their harmonics. The resulting products, especially $3^{rd}$ order products, often occur in uplink/receive frequency bands where the signal of interest is very weak, making coherent reception very difficult or impossible.

PIM is a form of electromagnetic interference that occurs in a wireless communication system when the system simultaneously transmits signals at multiple frequencies through passive devices, such as cables, connectors, antennas, mounting brackets, and other objects in or in proximity to the system's transmission path. PIM interference becomes particularly pronounced in nodes that transmit at high power, such as a cellular base station antenna. PIM is generated when two or more signals at different frequencies mix with each other due to nonlinearities in mechanical components of the system. Two signals may combine (through amplitude modulation) to produce sum and difference signals, including within the harmonic of the signals, within the operating bands of the wireless system, causing interference.

There are many mechanisms through which PIM can be created or propagated. Typically, the interactions and interconnections of electrically conductive mechanical components in a system can create a nonlinear element in the system. A nonlinearity may, in some cases, be caused by poor metal-to-metal contact at the location of an antenna mounting bracket, or if the bracket comprises a junction between dissimilar materials. For example, the fundamental frequencies (e.g., F1 and F2) of a cellular base station may be radiated by an antenna mounted on a galvanized steel mast. When currents are induced in the steel mast at these frequencies, those currents may encounter the mounting bracket (i.e., the nonlinearity), and be mixed within the nonlinearity to form a third current (i.e., the intermodulation current) at a new frequency, Fi. The intermodulation current may be radiated from the bracket as PIM, and/or conducted away from the bracket by a to conductive linear portion, which may act as an antenna for the PIM and radiate the PIM out with even better efficiency than the nonlinear bracket.

Magnetic absorbers can be applied to encapsulate the bracket, preventing the PIM from being radiated by the bracket, but intermodulation current may still travel from the bracket throughout the structure as well as to other antennas, eventually re-radiating and degrading the network.

Other causes of nonlinearities (and, therefore, PIM) may be contamination, (e.g., rust, corrosion, dirt, oxidation, etc.), loose connections, nearby metal objects (e.g., guy wires, anchors, roof flashing, pipes, etc.), or a variety of other causes.

According to some aspects of the present description, a wireless communication system (e.g., a system including a cellular base station as a component) includes an electrically-conductive, passive medium (e.g., the metallic structure of an antenna mast) capable of simultaneously propagating therealong electromagnetic first and second currents at different respective frequencies F1 and F2. In some embodiments, the first and second currents may be generated by two radio frequency (RF) signals being transmitted at similar but different frequencies (i.e., F1 and F2).

For example, in one embodiment, F1 may be 869 MHz and F2 may be 894 MHz, with an adjacent receive band for signals returned from external devices (e.g., a mobile device). For example, an adjacent receive band may be between 824 and 849 MHz. Another receive band may be adjacent at a frequency range above the transmit band (i.e., frequencies above the range of transmit band frequencies). These fundamental frequencies may mix to create products at new frequencies based on the formula nF1+mF2, where m and n may be positive or negative integers. Simple addition of the modulated signals (e.g., when both m and n are +1) in this example would produce a signal of 869+894=1763 MHz, and a difference (e.g., when n is +1 and m is −1) between the signals would be 894−869=25 MHz. Both 25 MHz and 1763 MHz are out of the receive bands of interest for a cellular system, and so these signals would not be of concern for that particular cellular system (although these frequencies may fall within the receive band or spectrum of interest of another, nearby system, and so may still cause PIM interference in those systems). However, when these signals combine to form third order (when the sum of the absolute values of m and n is 3) and sometimes higher order products, these can generate PIM signals within the receive bands of interest. For example, 2F1−F2 (844 MHz) and 2F2−F1 (919 MHz) produce 3rd order products within the receive portion of a cellular band that can lead to PIM distortion.

In some embodiments, the electrically conductive passive medium includes an electrically-conductive, first passive linear medium portion adjacent an electrically-conductive, first passive nonlinear medium portion, the first passive nonlinear medium portion capable of generating an intermodulation current based on a nonlinear interaction between the first and second currents. For example, in some embodiments, the electrically-conductive, first passive linear medium portion may be the metallic mast (e.g., a galvanized steel mast) to which a cellular antenna is mounted, and the electrically-conductive, first passive nonlinear medium portion may be a mounting bracket of a dissimilar metal. This junction or meeting point of dissimilar materials may create a nonlinearity that acts similar to a diode which causes the first and second currents (at frequencies F1 and F2) to mix to create an intermodulation current (PIM) at a new frequency. In some embodiments, the nonlinearity may be created by a junction between two dissimilar metals. In some embodiments, the nonlinearity may be created by a junction between a metal and a metal oxide (e.g., a metal oxide caused by oxidation effects). In some embodiments, the nonlinearity may be reacted by an area of corrosion or contamination (e.g., a region of rust, a contaminant such as dirt, poor metal-to-metal contact, etc.)

In some embodiments, the wireless communication system may further include an electrically conductive second passive linear medium portion adjacent the electrically conductive first passive nonlinear medium portion opposite the first passive linear medium portion (e.g., the nonlinear portion may be "sandwiched" between the first linear portion and the second linear portion). In some embodiments, a second magnetic film may be disposed proximate an electrically-conductive, external surface of the second linear portion, such that when the first and second currents propagate along the first linear portion toward the nonlinear portion, the first magnetic film reduces the generation of the intermodulation current in the first nonlinear portion by absorbing a portion of the first and second currents. In some embodiments, at least some of remaining portions of the first and second currents may mix in the first nonlinear portion, generating an intermodulation current which propagates through the first nonlinear portion and the second linear portion, where the intermodulation current is at least partially absorbed by the second magnetic film.

In some embodiments, the first and second currents may be induced by electromagnetic radiation transmitted from an antenna coupled to the electrically-conductive passive linear medium. In some embodiments, the first and second currents may be induced by electromagnetic radiation radiated from a second passive nonlinear medium which is coupled to the first passive linear medium portion. That is, PIM distortion may be created in a second nonlinear portion coupled to the linear portion and radiated from the second nonlinear portion, causing the currents to be induced in the linear portion.

In some embodiments, the intermodulation current may have a frequency Fi equal to nF1+mF2 which propagates along the first passive nonlinear medium portion, where m and n may be positive or negative integers. For example, as discussed elsewhere herein, n may be 2 and m may be −1, or n may be −1 and m may be 2. These values are examples only, and other values of n and m are possible. In some embodiments, one of m and n is a negative integer, and the other of m and n is a positive integer. In some embodiments, n may be equal to −1 and m equal to +2, such that Fi is be equal to 2F2−F1. In some embodiments, n may be equal to +2 and m equal to −1, such that Fi is be equal to 2F1−F2. In some embodiments, n may be equal to +1 and m equal to +1, such that Fi is be equal to F1+F2. In some embodiments, n may be equal to +2 and m equal to +2, such that Fi is be equal to 2F1+2F2. In some embodiments, F1 and F2 are both less than about 6 GHz. In some embodiments, both F1 and F2 are between about 600 MHz and 4 GHz. In some embodiments, both F1 and F2 are between about 600 MHz and 800 MHz. In some embodiments, F1 and F2 are frequencies which are less than about 100 MHz apart, or less than about 50 MHz apart.

In some embodiments, a first magnetic film is disposed proximate an electrically conductive external surface of the first linear medium portion, such that when the first and second currents propagate along the first passive linear medium portion toward the first passive nonlinear medium portion, the magnetic film reduces the generation of the intermodulation current in the first passive nonlinear medium portion by attenuating at least portions of the first and second currents (e.g., impede the propagation of the current through the corresponding structure). In some embodiments, the magnetic film may reduce the intensity of the intermodulation radiation generated by and radiated from the first passive nonlinear medium portion by at least 3 dB.

In some embodiments, the first magnetic film may be a magnetic absorber. One example of a magnetic absorber is the 3M™ EMI Shielding Absorber AB6000HF series of shielding films manufactured by the 3M Corporation. In some embodiments, the magnetic film may attenuate the first and second currents by absorbing at least portions of the magnetic fields generated by the first and second currents. In some embodiments, the first magnetic film does not cover any portion of the nonlinear portion.

According to some aspects of the present description, a wireless communication system includes an antenna (e.g., a cellular antenna); an electrically conductive passive linear medium portion electrically interconnected with an electrically conductive passive nonlinear medium portions (e.g., the junction of two dissimilar materials, such as a mounting bracket and an antenna mast), such that when the antenna radiates electromagnetic first and second waves at different respective frequencies F1 and F2, the first and second waves induce respective first and second currents propagating through the first passive nonlinear medium portion, the first passive nonlinear medium portion mixing the first and second currents to generate a third current (i.e., an intermodulation current, or PIM) having a frequency nF1+mF2 and propagating along the passive nonlinear and linear medium portions, where m and n are integers which may be either positive or negative. In some embodiments, a magnetic film may be disposed on the passive linear, but not the nonlinear, medium portion and absorbing at least a portion of the third current. For example, in some embodiments, the magnetic film may be a magnetic absorbing film wrapped around an antenna mast (linear medium portion) adjacent to and in the propagation pathway prior to an attached antenna mounting bracket (nonlinear medium portion). In some embodiments, placement of the magnetic film on the linear medium portion may impede the propagation of currents which may contribute to PIM interference. In some embodiments, the magnetic film may be disposed on both the passive linear medium portion and the passive nonlinear medium portion.

According to some aspects of the present description, a wireless communication system (e.g., a cellular base station) may include one or more antennas; a plurality of spaced apart electrically conductive first sections (e.g., one or more mounting brackets, or an irregular weld); a plurality of electrically conductive second sections (e.g., sections of an antenna mast) interconnecting the first sections, such that when the one or more antennas radiate electromagnetic first and second waves at different respective frequencies F1 and F2, the first and second waves induce respective first and second currents at the respective F1 and F2 frequencies, which may propagate through the first and second sections. In some embodiments, the first sections may cause the mixing of the first and second currents (e.g., combining through amplitude modulation) to generate a third current (e.g., an intermodulation current) at a frequency Fi different from F1 and F2. In some embodiments, the generated third current may propagate along the first and second sections, causing the first, but not the second, sections to generate electrical currents at the new Fi frequency, which may be propagated along the second section which may then radiate electromagnetic energy at the frequencies Fi. In some embodiments, the second section may also generate an electrical current at the Fi frequency, which may contribute to the radiated electromagnetic energy. In some embodiments, this "mixing" of currents may be caused by a nonlinearity in the first sections. For example, corrosion on a mounting bracket, or a loose connection, or any number of other causes, may cause the nonlinearity in the first section, causing the first section to act as a current mixer, producing a third (intermodulation) current based on the first and second currents and their respective frequencies. In some embodiments, a magnetic film (e.g., a magnetic absorber) may be disposed on an electrically conductive surface of each second section (e.g., wrapped around or placed on an external surface of the section) to absorb at least a portion of the third current propagating along the second section.

According to some aspects of the present description, a wireless communication system is provided including one or more antennas (e.g., multiple cellular antennas on a cellular base station); one or more transceivers (e.g., transceivers housed in a base transceiver station, or BTS, used to facilitate wireless communication between mobile devices and a cellular network) coupled to the one or more antennas; a plurality of electrically conductive passive linear medium portions interconnected with a plurality of electrically conductive passive nonlinear medium portions, and a magnetic film (e.g., magnetic absorber) disposed on at least some of the linear, but none of the nonlinear, medium portions. In some embodiments, each linear and nonlinear medium portion may be capable of simultaneously propagating electromagnetic first and second currents at different respective frequencies F1 and F2. In some embodiments, each passive nonlinear portion, but not linear portion, may be capable of mixing or otherwise combining the first and second currents to generate a third current having a frequency nF1+mF2 and propagating along the passive nonlinear medium portion, where m and n being positive or negative integers. In some embodiments, the magnetic absorbers placed on the linear portions may impede the formation of currents in the linear portions which could otherwise contribute to the generation of the third current (e.g., a PIM current) when they encounter a non-linear portion. In some embodiments, a PIM current can cause a PIM radiation which will increase the overall noise level within the frequency band of interest (e.g., a cellular band) used by the transceivers and lead to dropped or distorted communication signals.

Figure 1:
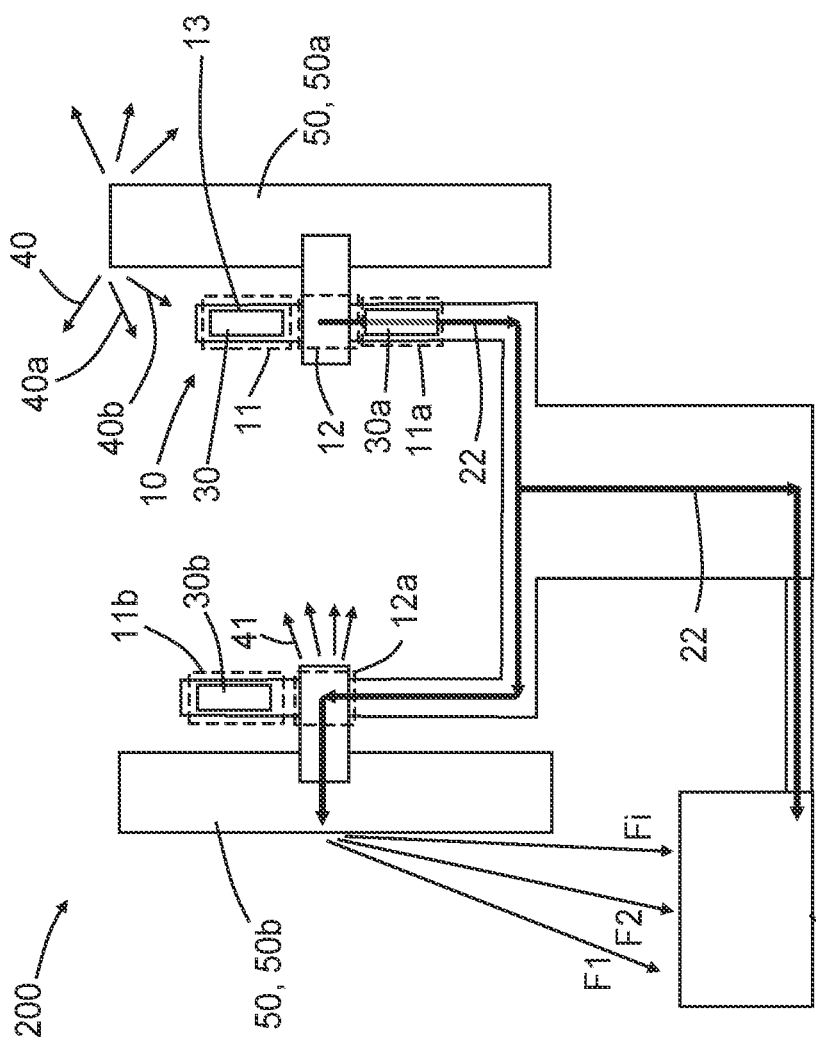
FIG. 1 is a side view of a wireless communication system, in accordance with an embodiment of the present description.

Turning now to the figures, FIG. 1 is a side view of a wireless communication system, according to the present description. In some embodiments, a wireless communications system 200 includes one or more antennas 50 disposed on (e.g., mounted on and supported by) an electrically-conductive passive medium 10 (e.g., a metallic antenna mast or mounting structure). In some embodiments, the electrically-conductive passive medium 10 may include two different portions, an electrically-conductive passive linear portion 11 (e.g., a primary, substantially heterogeneous element, such as a main shaft, of the mounting structure) and an electrically-conductive passive nonlinear portion 12 (e.g., a mounting bracket, weld bead, or other connecting structure). It should be noted that nonlinear portion 12 may be created by the presence of a different material and/or disparate condition relative to the linear portion 11. That is, a nonlinear element may be created at the interface between two different metals (e.g., the galvanized steel of an antenna mast and the metal used in a mounting bracket attached to the mast), from a loose or corrupted connector point or cable, from rust, corrosion, dirt, oxidation, etc., from nearby metallic objects such as roof flashing or pipes, or from any of a number of other causes. For the purposes of illustration, the nonlinear element 12 is shown in FIG. 1 coincident with a mounting bracket for an antenna, but may in reality be any appropriate nonlinearity of any appropriate cause or condition.

In some embodiments, wireless communications system 200 may also include one or more transceivers 60 (e.g., transceivers housed in a base transceiver station for a cellular base station) coupled to the antennas 50. In some embodiments, transceivers 60 may be used to facilitate wireless communication between external devices and the wireless network. In some embodiments, transceivers 60 may be high-power transceivers (e.g., 20 W or greater).

In operation, in some embodiments, the transceivers 60 of the wireless communication system 200 may generate two or more radio frequency (RF) signals, each at a unique frequency. The signals propagate through a transmission line (e.g., a coaxial cable, or a fiber optic) to be broadcast/radiated from antennas 50 (e.g., a first antenna 50a) as electromagnetic radiation 40. In some embodiments, electromagnetic radiation 40 may include electromagnetic first waves 40a, radiating at frequency F1, and electromagnetic second waves 40b, radiating at frequency F2. In some embodiments, when electromagnetic first waves 40a and electromagnetic second waves 40b impinge upon the structure comprising the linear and nonlinear portions 11 and 12, respectively, first waves 40a and second waves 40b may induce first current 20 and second current 21, respectively, within the nonlinear portion 12 at corresponding frequencies F1 and F2 (first current 20 and second current 21 are shown in FIG. 2). In some embodiments, nonlinear portion 12 may act as a mixer, combining first current 20 and second current 21 to produce a third current (i.e., an intermodulation current) 22 at a third frequency Fi. Third current 22 (as well as first current 20 and second current 21) may then propagate throughout electrically-conductive passive medium 10 (e.g., follow the path of the metallic antenna mast) possibly flowing back into transceiver 60, or into one or more antennas 50, or reradiating into space at new frequency Fi as second electromagnetic radiation 41, and thereby back to one or more antennas, 50. In some embodiments, a second antenna 50b may re-transmit or receive RF signals originally generated at first antenna 50a (with fundamental frequencies F1 and F2), including PIM signals at frequency Fi created within one or more nonlinearities 12/12a). These RF signals (and in particular the Fi signal) may be seen as increased noise at transceiver 60, greatly reducing the SNR of the intended signals.

To mitigate the effects of PIM, one or more magnetic films 30 (in some embodiments, including 30a and 30b) may be disposed on or near an electrically conductive external surface 13 of linear medium portion 11. In some embodiments, magnetic film 30 may reduce or prevent the generation of the intermodulation current 22 in the nonlinear portion 12. In some embodiments, intermodulation current 22 may be reduced by the magnetic film 30 in a number of ways. In some embodiments, magnetic film 30 may attenuate one or both of the first and second currents before they enter the nonlinear portion 12, such that the intermodulation current 22 is not generated, or is reduced significantly. In some embodiments, magnetic film 30 may intercept currents or radiated energy from nonlinear portion 12 as it exits nonlinear portion 12 before entering into linear portion 11/11a/11b. In some embodiments, additional magnetic films 30 (such as films 30a and/or 30b) may be disposed on or proximate to additional linear portions 11 (such as portions 11a and/or 11b) to help attenuate currents induced in or passing through the structures. In some embodiments, for example, a magnetic film 30 (e.g., a magnetic absorber) may be placed on the linear portions 11 on either side of a nonlinear portion 12, such that currents generated in or otherwise exiting nonlinear portion 12 are attenuated and/or eliminated.

FIG. 2 is a side view of the electrically conductive passive medium 10 of FIG. 1, showing additional detail regarding the creation of an intermodulation current. Electromagnetic radiation (RF signals) broadcast by a nearby antenna or radiated by another conducting structure (as shown in FIG. 1) induce a first current 20 (corresponding to an RF signal with fundamental frequency F1) and a second current 21 (corresponding to an RF signal with fundamental frequency F2) within an electrically-conductive passive medium 10 (e.g., a metallic portion of an antenna mast). In some embodiments, first current 20 and second current 21 may be induced within an electrically-conductive passive linear portion 11 of electrically-conductive passive medium 10, and then travel throughout other portions of the structure. In these embodiments, first current 20 and second current 21 may propagate through electrically-conductive passive linear portion 11 until they encounter an electrically-conductive passive nonlinear portion 12. As described elsewhere herein, nonlinear portion 12 may be created by a number of things, including but not limited to a junction between disparate materials, a loose connection between mechanical parts, an area of corrosion or damage, the proximity of other electrically-conductive components (e.g., pipes or roof flashing), etc. As first current 20 and second current 21 enter nonlinear portion 12, the nonlinearity may cause the first current 20 and second current 21 to mix, generating new currents with new frequencies. In some embodiments, at least a third current 22 is generated, which has a frequency Fi which may represent, for example, a third order harmonic of F1 and F2, which may be calculated using the formula Fi=nF1+mF2, where n and m may be positive or negative integers. Stated another way, the third current may be an intermodulation current which has a frequency Fi that may cause the intermodulation signal to, when radiated from an antenna or other structure, be received by antenna 50 in the frequency region intended for reception of signal from an external device (e.g., a mobile device, such as a cellular phone), thereby raising the noise level and reducing the fidelity of the received signal. This will in turn reduce the rate at which information can be transferred from the mobile device to the antenna, 50, or may cause the connection from the mobile device to the antenna to be lost (i.e., a "dropped call"). In other embodiments, first current 20 and second current 21 may be induced directly in the nonlinear portion 12 (rather than originating in the linear portion 11 and propagating into the nonlinear portion 12). In these embodiments, each of the currents 20 and 21, as well as the intermodulation current 22, may propagate out of and away from nonlinear portion 12 and into an adjacent linear portion 11.

In some embodiments, a magnetic film 30 may be disposed on (e.g., placed on an external surface or wrapped around) the linear portion 11 of electrically-conductive passive medium 10 adjacent to a nonlinear portion 12. In some embodiments, the magnetic film 30 may be a magnetic absorber which at least partially attenuates the first current 20 and second current 21 (through absorption of the magnetic fields they produce adjacent to the linear section), as well as at least a portion of any electromagnetic fields created by current 20 and 21, before they enter the nonlinear portion 12. By reducing or eliminating the first current 20 and the second current 21 before they enter the nonlinear portion 12, the creation of the third (intermodulation) current 22 may be prevented or significantly reduced. In some embodiments, when the first current 20 and second current 21 are first generated within the nonlinear portion 12, the magnetic film 30 may limit or eliminate any currents attempting to exit the nonlinear portion 12, including first current 20, second current 21, and third current 22.

Figure 3:
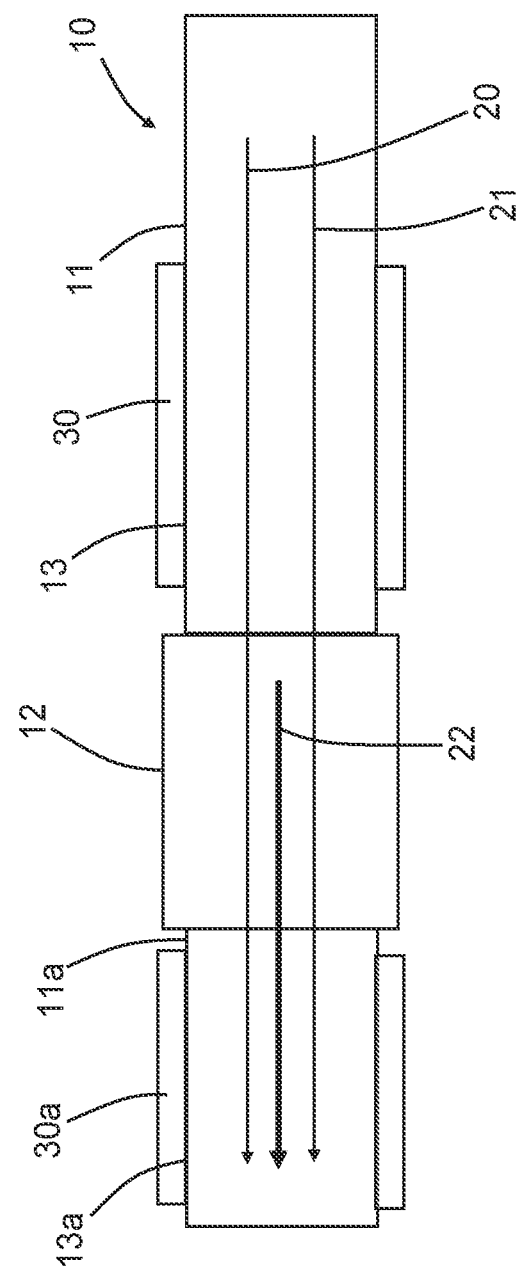
FIG. 3 is a side view of an electrically conductive passive medium with magnetic absorbing films, in accordance with an embodiment of the present description.

In some embodiments, two or more magnetic films 30 may be disposed on multiple linear portions 11 (e.g., the shaft of an antenna mast that extends both above and below a nonlinear portion such as a mounting bracket) to prevent or reduce PIM currents that may be generated within nonlinear portion 12 from propagating throughout other portions of electrically-conductive passive medium 10. FIG. 3 provides a side, cut-away view of an electrically conductive passive medium 10 with magnetic absorbing films, in accordance with an embodiment of the present description. In the embodiments shown, the electrically conductive passive medium 10 includes an electrically conductive first passive linear medium portion 11 (or "first linear portion") and an electrically conductive second passive linear portion 11a (or "second linear portion"), both of which are adjacent the electrically conductive first passive nonlinear medium portion 12 (or "nonlinear portion"). That is, the first linear portion 11 and the second linear portion 11a are disposed on either side of the nonlinear portion 12. A first magnetic film 30 is disposed proximate to an electrically conductive external surface 13 of first linear portion 11 (e.g., wrapped around first linear portion 11), and a second magnetic film 30a is disposed proximate to an electrically conductive external surface 13a of second linear portion 11a. In some embodiments, first induced current 20 and second induced current 21 propagate along first linear portion 11 and enter nonlinear portion 12. Once entering nonlinear portion 12, the first current 20 and second current 21 may mix to create a third or intermodulation current 22, which may then propagate out of nonlinear portion 12 as a surface wave. By placing the first magnetic film 30 and second magnetic film 30a on either side of the nonlinear portion (i.e., disposed on first and second linear portions 11 and 11a), the magnetic films 30 and 30a may absorb any electrical currents either trying to enter the nonlinear portion 12 (where they may mix to create new currents at new frequencies) or trying to exit the nonlinear portion 12. By absorbing these currents (including any PIM currents created), and by additionally absorbing or preventing the formation of electromagnetic fields due to the currents, the magnetic films 30 and 30a can eliminate or significantly reduce PIM interference.

Figure 4:
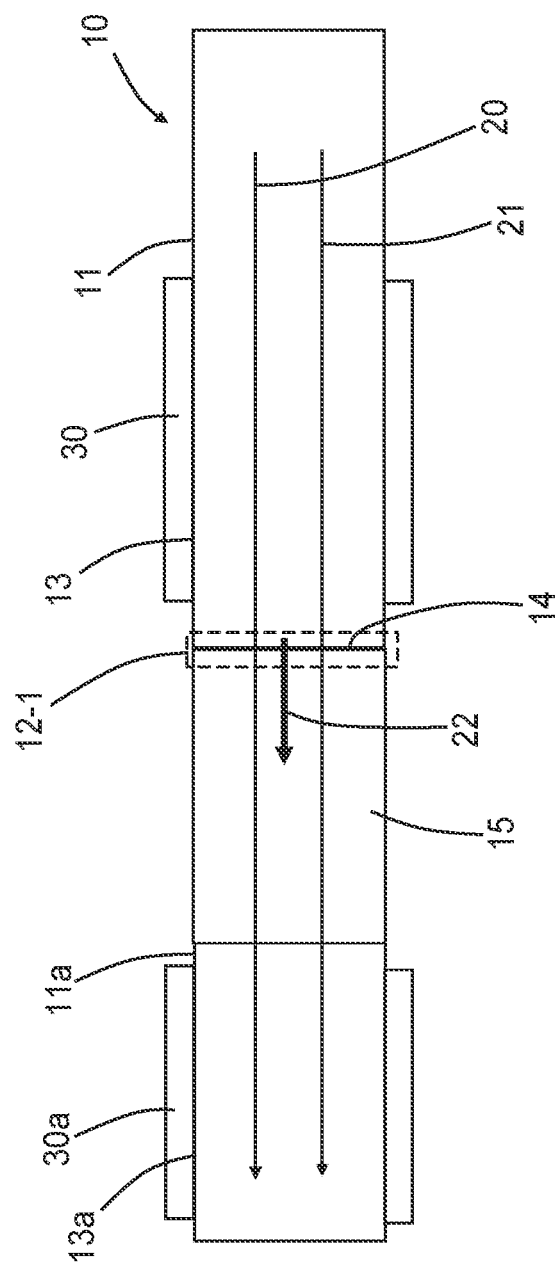
FIG. 4 is a side view of an electrically conductive passive medium illustrating a junction between a first and second electrically conductive portions, in accordance with an embodiment of the present description.
Figure 6:
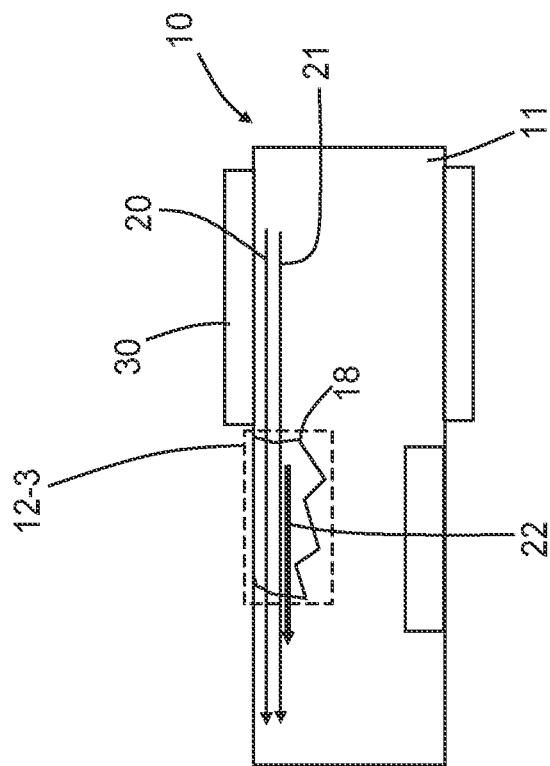
FIG. 6 is a side view of an electrically conductive passive medium illustrating metal corrosion, in accordance with an alternate embodiment of the present description.
Figure 5:
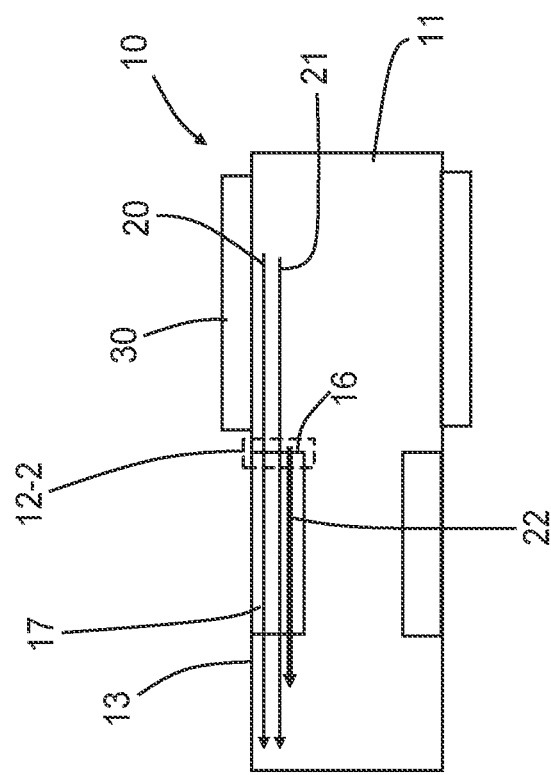
FIG. 5 is a side view of an electrically conductive passive medium illustrating a junction between a metal and a metal oxide, in accordance with an alternate embodiment of the present description.

The example nonlinearity (i.e., nonlinear portion 12) shown in FIG. 3 may be created by a mounting bracket or mounting hardware which is of a sufficiently different material than electrically-conductive passive medium 10, or which is loosely connected to electrically-conductive passive medium 10, such that the disparity leads to the nonlinear component. In another example, the nonlinearity may be a rusted bolt or other fastener connecting two portions of electrically conductive passive medium 10, or of a material sufficiently different than passive medium 10. FIGS. 4, 5, and 6 provide side, cutaway views of similar embodiments of a wireless communication system, in which various components and/or conditions create a nonlinearity, potentially leading to the creation of PIM interference, according to descriptions herein. FIGS. 4, 5, and 6 each contain like-numbered elements in common with those of FIG. 3, and which serve similar functions. Like-numbered elements which have already been described in regard to FIG. 3 may not be discussed again for FIGS. 4, 5, and 6, except as required.

FIG. 4 is a side, cutaway view of electrically conductive passive medium 10, in which a nonlinearity 12-1 is created by a junction between a first metal 11 and a second different metal 15. For example, the area of surface contact between a first metal 11 and second different metal 15 may have different electrochemical potential, creating a nonlinear I/V curve (non-linear junction). The use of one or more magnetic films 30/30a disposed on external surfaces 13/13a adjacent the nonlinearity 12-1 can absorb/mitigate the induced currents propagating to and intermodulation currents propagating away from this non-linear junction, which can contribute to the creation of PIM effects.

FIG. 5 is a side view of an electrically conductive passive medium 10, in which a nonlinearity 12-2 is created by a junction between a metal 11 and a metal oxide 17. For example, in some embodiments, an ionic chemical reaction may occur on the surface of an exposed metal when oxygen is present, causing electrons from the metal to move to the oxygen molecules, creating negative oxygen ions which can create an oxide surface on the metal. The interface between the original metal and created metal oxide can be a source of PIM. Disposing one or more magnetic films 30 adjacent to the nonlinearity 12-2 can help mitigate the creation of PIM distortion, as described herein.

FIG. 6 is a side view of an electrically conductive passive medium 10, in which a nonlinearity 12-3 is created by a region of rust 18 on the electrically conductive passive medium 10. Other conditions which can create nonlinearities, include but are not limited to contaminants (e.g., a dirty connection), a loose connection, irregular metal-to-metal contact (e.g., a bad weld bead), and uneven contact surfaces. Disposing one or more magnetic films 30 adjacent to the nonlinearity 12-3 can help mitigate the creation of PIM distortion, as described herein.

Figure 7:
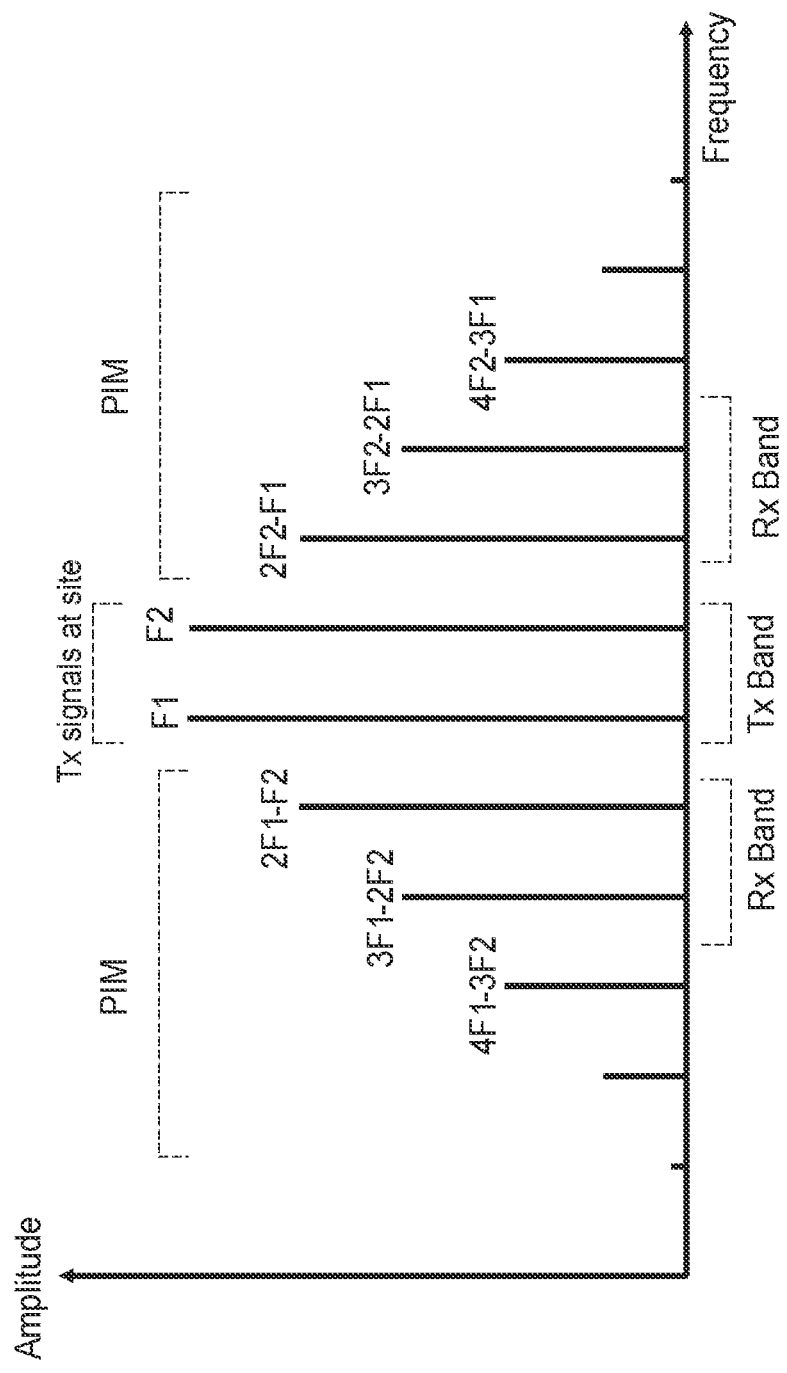
FIG. 7 is a graph illustrating transmission and intermodulation frequencies of a wireless communication system, in accordance with an embodiment of the present description.

Finally, FIG. 7 is a graph that illustrates the frequencies of transmission signals and intermodulation signals in a wireless communication system, as described in the current description. The y-axis indicates the relative amplitude (strength) of the signals, and the x-axis shows relative frequency bands of the signals. In the center of the graph, the transmit or Tx band includes (in this example) the two intended signals for transmission, which are labeled based on their corresponding frequency, F1 and F2, as described elsewhere herein. Moving out in either direction from the Tx band signals are the odd numbered passive intermodulation signals that may be generated by the mixing of the Tx band signals. Moving to the left of the page from the F1 signal are the third-order intermodulation, fifth-order intermodulation, seventh-order intermodulation, and so on. Moving to the right of the page from the F2 signal are the alternate third-order intermodulation, fifth-order intermodulation, seventh-order intermodulation, and so on. For example, the signal immediately to the left of the F1 signal is the third-order passive intermodulation radiation (PIM) produced by the formula $nF1+mF2$ when $n=+2$ and $m=-1$ (i.e., $2F1-F2$). As is seen in FIG. 7, this third-order intermodulation falls into one of the intended receive or Rx bands in use by the wireless communication system, and the amplitude of the signal is still relatively high. These types of PIM signals may interfere with the reception of intended, legitimate signals by raising the level of noise and reducing the signal-to-noise ratio (SNR) of the signals. The use of magnetic absorbers as described herein can help mitigate the creation of these PIM distortion signals and improve the SNR of the intended wireless system signals.

Terms such as "about" will be understood in the context in which they are used and described in the present description by one of ordinary skill in the art. If the use of "about" as applied to quantities expressing feature sizes, amounts, and physical properties is not otherwise clear to one of ordinary skill in the art in the context in which it is used and described in the present description, "about" will be understood to mean within 10 percent of the specified value. A quantity given as about a specified value can be precisely the specified value. For example, if it is not otherwise clear to one of ordinary skill in the art in the context in which it is used and described in the present description, a quantity having a value of about 1, means that the quantity has a value between 0.9 and 1.1, and that the value could be 1.

Terms such as "substantially" will be understood in the context in which they are used and described in the present description by one of ordinary skill in the art. If the use of "substantially equal" is not otherwise clear to one of ordinary skill in the art in the context in which it is used and described in the present description, "substantially equal" will mean about equal where about is as described above. If the use of "substantially parallel" is not otherwise clear to one of ordinary skill in the art in the context in which it is used and described in the present description, "substantially parallel" will mean within 30 degrees of parallel. Directions or surfaces described as substantially parallel to one another may, in some embodiments, be within 20 degrees, or within 10 degrees of parallel, or may be parallel or nominally parallel. If the use of "substantially aligned" is not otherwise clear to one of ordinary skill in the art in the context in which it is used and described in the present description, "substantially aligned" will mean aligned to within 20% of a width of the objects being aligned. Objects described as substantially aligned may, in some embodiments, be aligned to within 10% or to within 5% of a width of the objects being aligned.

All references, patents, and patent applications referenced in the foregoing are hereby incorporated herein by reference in their entirety in a consistent manner. In the event of inconsistencies or contradictions between portions of the incorporated references and this application, the information in the preceding description shall control.

Descriptions for elements in figures should be understood to apply equally to corresponding elements in other figures, unless indicated otherwise. Although specific embodiments have been illustrated and described herein, it will be appreciated by those of ordinary skill in the art that a variety of alternate and/or equivalent implementations can be substituted for the specific embodiments shown and described without departing from the scope of the present disclosure. This application is intended to cover any adaptations or variations of the specific embodiments discussed herein. Therefore, it is intended that this disclosure be limited only by the claims and the equivalents thereof.

What is claimed is:

1. A wireless communication system comprising:
an electrically conductive passive medium capable of simultaneously propagating therealong electromagnetic first and second currents having different frequencies, the electrically conductive passive medium comprising an electrically conductive first passive linear medium portion and an electrically conductive first passive nonlinear medium portion; and
a first magnetic film disposed proximate an electrically conductive external surface of the first passive linear medium portion, such that when the first and second currents propagate along the first passive linear medium portion toward the first passive nonlinear medium portion, the magnetic film attenuates the first and second currents so as to reduce an intensity of an intermodulation current generated and radiated from the first passive nonlinear medium portion by at least 3 dB.

2. The wireless communication system of claim 1, wherein the first passive nonlinear medium portion comprises a junction between different first and second metals.

3. The wireless communication system of claim 1, wherein the first passive nonlinear medium portion comprises a junction between a metal and a metal oxide.

4. The wireless communication system of claim 1, wherein the first passive nonlinear medium portion comprises a rusty region of the electrically conductive passive medium.

5. The wireless communication system of claim 1, wherein the first and second currents propagating along the first passive linear medium portion toward the first passive nonlinear medium portion are induced by electromagnetic radiation radiated from an antenna and coupled to the first passive linear medium portion.

6. The wireless communication system of claim 1, wherein the first and second currents propagating along the first passive linear medium portion toward the first passive nonlinear medium portion are induced by electromagnetic radiation radiated from a second passive nonlinear medium and coupled to the first passive linear medium portion.

7. The wireless communication system of claim 1, wherein the first magnetic film does not cover any portion of the first passive nonlinear medium portion.

\* \* \* \* \*